US012738341B2

(12) United States Patent
Opastrakoon et al.

(10) Patent No.: US 12,738,341 B2
(45) Date of Patent: Sep. 15, 2026

(54) CYCLING REPLACEMENT BLOCKS BASED ON A DIE WAFER LOCATION

(71) Applicant: MICRON TECHNOLOGY, INC., Boise, ID (US)

(72) Inventors: Tawalin Opastrakoon, Boise, ID (US); Sean Brasfield, Boise, ID (US); Chonggiap Chiew, Singapore (SG)

(73) Assignee: MICRON TECHNOLOGY, INC., Boise, ID (US)

(*) Notice: Subject to any disclaimer, the term of this patent is extended or adjusted under 35 U.S.C. 154(b) by 107 days.

(21) Appl. No.: 18/951,040

(22) Filed: Nov. 18, 2024

(65) Prior Publication Data

US 2026/0141975 A1 May 21, 2026

(51) Int. Cl.
*G11C 29/00* (2006.01)

(52) U.S. Cl.
CPC .......... *G11C 29/808* (2013.01); *G11C 29/789* (2013.01)

(58) Field of Classification Search
CPC ............................ G11C 29/808; G11C 29/789
See application file for complete search history.

(56) References Cited

U.S. PATENT DOCUMENTS 11,107,549 B2 * 8/2021 Cowles ................ G11C 29/787
11,656,274 B2 * 5/2023 Rathert .............. G01R 31/2894 324/757.04
2012/0059979 A1 * 3/2012 Aoyagi ................ G11C 29/883 711/E12.008
2012/0096321 A1 * 4/2012 Yeh ..................... G06F 12/0246 714/710
2014/0359382 A1 * 12/2014 Choi ................... G06F 12/0246 714/710
2015/0186065 A1 * 7/2015 Seo ....................... G06F 3/0619 711/103

OTHER PUBLICATIONS

Y.-H. Chang and T.-W. Kuo, "A commitment-based management strategy for the performance and reliability enhancement of flash-memory storage systems," 2009 46th ACM/IEEE Design Automation Conference, San Francisco, CA, USA, 2009, pp. 858-863 (Year: 2009).*

Y.-H. Chang and T.-W. Kuo, "A Management Strategy for the Reliability and Performance Improvement of MLC-Based Flash-Memory Storage Systems," in IEEE Transactions on Computers, vol. 60, No. 3, pp. 305-320, Mar. 2011 (Year: 2011).*

* cited by examiner

*Primary Examiner* — Cynthia Britt
(74) *Attorney, Agent, or Firm* — Tarolli, Sundheim, Covell & Tummino LLP

(57) ABSTRACT

A technique is disclosed for cycling replacement blocks based on die wafer location data. The die wafer location data can provide a die location failure value for each die of a memory device. Each die location failure value can indicate a likelihood of die failure during operation of the memory device. A die of the memory device can be identified as a high-risk die corresponding to a die of the memory device as most likely to experience a die failure based on the die wafer location data. One or more reserved blocks of the high-risk die can be identified. The reserved blocks of the high-risk die can be cycled.

20 Claims, 6 Drawing Sheets

CYCLING REPLACEMENT BLOCKS BASED ON A DIE WAFER LOCATION

TECHNICAL FIELD

This disclosure relates to cycling replacement blocks based on a die wafer location.

BACKGROUND

A memory sub-system includes a memory device designed for data storage. These memory devices are implemented as non-volatile and volatile memory devices in various examples. In some such examples, a host system employs a memory sub-system for the purposes of storing data on the memory devices and for retrieving data from the memory devices. Not-AND (NAND) flash memory is a type of non-volatile storage technology used in electronic devices and computers for data storage. In NAND flash memory, data is stored in memory cells that can hold electrical charges, representing data bits. Wear leveling is a technique used in NAND flash memory devices to distribute program and erase (P/E) cycles across memory blocks so that the memory blocks do not wear out prematurely.

DETAILED DESCRIPTION

Figure 1:
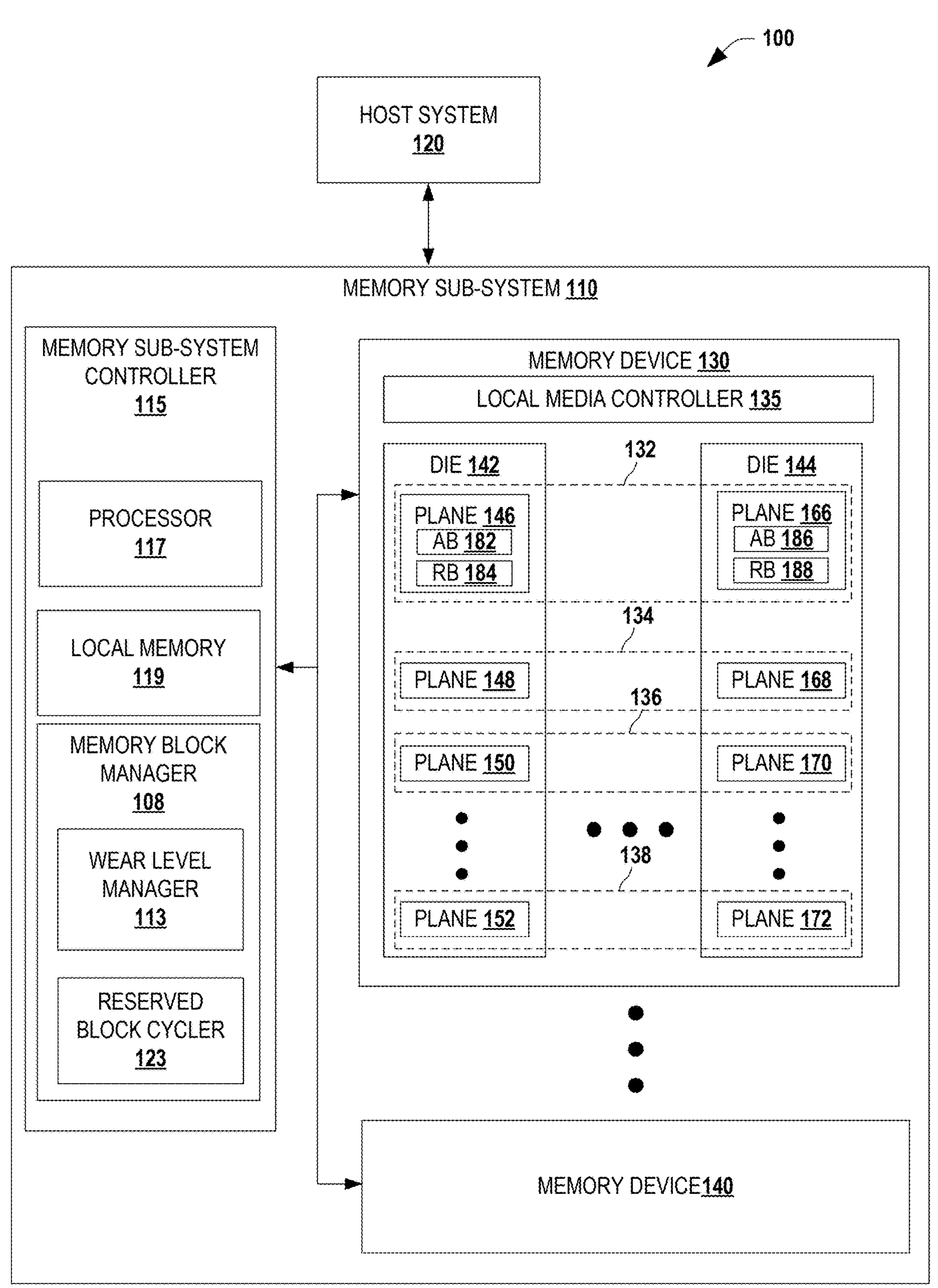
FIG. 1 is an example of a computing system that includes a memory sub-system in accordance with some examples of the present disclosure.

This description relates to cycling replacement blocks based on a die wafer location. In some examples, a memory sub-system (e.g., a solid-state drive (SSD)) can be configured with a controller that executes a reserved block cycler for proactively cycling of replacement (reserved) memory blocks based on a die wafer location within a memory device, such as a NAND memory device. The reserved block cycler uses the die wafer location data to determine a likelihood of failure for each die (e.g., a memory die) used in the memory device, during operation and assigns a die location failure value to categorize the dies of the memory device as high-risk or low-risk dies.

High-risk dies correspond to memory dies that are more prone to defects and early failure due to the location of these dies on a wafer during fabrication. The reserved block cycler cycles the reserved blocks of the high-risk dies (while not cycling the reserved blocks of the low-risk dies in some instances) to ensure that these blocks of the high-risk dies have the same or similar wear characteristics as active memory blocks when needed for replacement. The proactive cycling of reserved blocks in high-risk dies improves the reliability and longevity of the memory device by mitigating premature failures, thereby optimizing performance over time. Furthermore, by cycling the replacement blocks of the high-risk dies this minimizes unnecessary reserved block cycling at low-risk dies, which reduces a performance overhead of the memory sub-system and extends a useful life of high-risk dies and the memory sub-system overall.

More generally, a memory sub-system refers to a storage device, a memory module or some combination thereof. The memory sub-system includes a memory device or multiple memory devices that store data. The memory devices can be volatile or non-volatile devices. Some examples of a memory sub-system include high density non-volatile memory devices where retention of data is desired during intervals of time where no power is supplied to the memory device. An SSD is an example of a memory sub-system that includes a non-volatile memory device(s) and a memory sub-system controller (referred to herein as a controller or memory controller) to manage the non-volatile memory devices.

One example of non-volatile memory devices is a NAND memory device. A non-volatile memory device is a package that includes a die(s). Each such die can include a plane(s). A plane is a subdivision within a die. Thus, each die within a NAND flash chip (e.g., NAND memory device) can include multiple planes, which allows for parallel operations to be executed on the memory device, such as programming, erasing and reading operations.

In NAND memory devices, each plane can include a set of physical blocks and each physical block can include a set of pages. A page is a smallest unit that can be programmed. A page can refer to a group of memory cells (for simplicity cells). A cell is an electronic circuit that stores information. A cell stores at least one bit of binary information and can have logic states that correlate to a number of bits being stored. The logic states are represented by binary values, such as "0" and "1", or as combinations of such values, such as "00", "01", "10" and "11". A memory array is a grid of cells organized into rows and columns.

In some examples, each page can represent a subset of cells from the memory array and cells in a page can be read/written simultaneously. Thus, a memory array can be divided into multiple pages, wherein each page includes a subset of cells of the memory array. In some examples, the page includes all of the cells of the memory array. In yet further examples, each page that represents the group of memory cells can be spread across multiple wordlines in a memory array, and these cells can be accessed together for read and write operations.

The cells can be arranged in a two-dimensional or a three-dimensional grid. In some examples, the memory cells are formed on a silicon wafer (e.g., a die) in an array of columns connected by conductive lines (also referred to as bitlines, or BLs) and rows connected by conductive lines (also referred to as wordlines or WLs). A wordline has a row of associated memory cells in a memory device that are used with a bitline or multiple bitlines to generate an address of each of the memory cells.

The intersection of a bitline and a wordline defines an address of a given memory cell. Each memory cell of a memory array can be a single-level cell (SLC) or a higher-order cell (also known as a multi-level cell), which can store multiple bits per cell (e.g., different logic states). Examples of higher-order cells can include multi-level cells (MLCs), triple-level cells (TLCs), quad-level cells (QLCs), penta-level cells (PLC's) or higher-level cells.

A block (or a memory block) refers to a unit of the memory device used to store data. A block is a smallest erasable unit in a memory device, such as the NAND memory device. In various examples, the erasable unit could be implemented as a group of memory cells, a wordline group, a wordline or as individual memory cells. Multiple blocks can be grouped together to form separate partitions (e.g., planes) in the memory device, which allows for concurrent operations to take place on different planes.

For example, memory blocks can be formed by grouping pages, wherein each page contains (holds) a certain amount of data (e.g., 4 kilobytes (KB) to 16 KB per page as an example). Thus, a memory block can consist of multiple pages. In NAND memory devices, read and write operations can be performed at a page level (e.g., data can be accessed and written page by page). Data can be erased at a block level (e.g., pages within the memory block can be erased together) in NAND memory devices.

In memory sub-systems, such as an SSD, memory blocks can be grouped from different planes within a same die or multiple dies into a superblock. A superblock is a collection of memory blocks from multiple planes within a die or across multiple dies in an SSD. For example, if a die has 4 planes, a superblock can include one block from each of the 4 planes. Operations such as program (write) and/or erase on the SSD can be performed at a superblock level (e.g., memory blocks within a superblock can be programmed or erased simultaneously).

For example, when data is written (programmed) on the SSD, the data is written across the blocks of the superblock. The memory controller (e.g., an SSD memory controller) writes data to one page in each block of the superblock. By contrast, when data is erased on the SSD, the data is erased at a block level, which results in the memory blocks of the superblock being erased at about a same time or concurrently. For example, the memory controller (e.g., the SSD memory controller) can erase the memory blocks of the superblock using a coordinated erase operation.

Wear leveling is a process employed on NAND flash memory devices, such as SSDs, to distribute program and erase (P/E) cycles (also referred to herein as cycles for simplicity) across memory blocks within one or more superblocks to curtail premature block wear. Wear leveling techniques (e.g., wear leveling algorithms) are used to regulate wear experienced by the memory blocks by controlling (regulating) a number of P/E cycles each block undergoes. Wear leveling can include dynamic and static wear leveling.

In dynamic wear leveling, P/E cycles are distributed across blocks that are actively being written. The memory controller (the wear leveling algorithm) monitors a usage of blocks across superblocks and relocates frequently written data across blocks or superblocks to prevent overuse of any individual memory block. Static wear leveling is used to redistribute P/E cycles across blocks that are unused or infrequently written to so that the memory blocks are more uniformly worn (e.g., have about a same or similar number of P/E cycles).

For example, the memory controller can be configured with a wear level manager to execute the wear leveling algorithm. The wear leveling algorithm can be used to distribute P/E cycles across memory blocks of one or more superblocks. The wear level manager (the wear leveling algorithm) is configured/programmed to track P/E cycles of the memory blocks (or superblocks) and redistribute data so that the blocks (or superblocks) wear out evenly over time (e.g., have about a same or similar number of P/E cycles). The wear level manager monitors the number of P/E cycles that each memory block undergoes for each block or superblock in the memory device.

For instance, each time a memory block is programmed (written) and erased, a P/E cycle count for that block is incremented by the wear level manager. The wear level manager can use a table, which can be referred to as a P/E cycle count table, to record and track a P/E cycle count of each block (or in some instances a superblock).

In examples in which the memory controller needs to write new data, the wear level manager selects blocks (or superblocks) that have experienced fewer P/E cycles so that block wear can be balanced. Blocks (or superblocks) that have undergone a large number of P/E cycles (e.g., that are near a wear limit corresponding to a P/E cycle count limit) are avoided by the memory controller and blocks with fewer P/E cycles are prioritized (e.g., used) over the avoided blocks for data writes. For example, if Block 3 has undergone 1000 P/E cycles and Block 2 has undergone 300 P/E cycles, the wear level manager can identify (select) Block 2 for a write operation.

Some memory blocks in NAND flash memory devices store data (e.g., operating system files) that does not change frequently. If such blocks are infrequently (rarely) written to, these blocks can experience fewer P/E cycles than more frequently used blocks. In such scenarios, the wear level manager can be programmed to periodically relocate static or less frequently accessed data from low-worn blocks to blocks with higher wear so that the blocks experience a same or similar wear level over time. For example, if Block 1 has undergone 500 P/E cycles and stores static data and Block 4 has undergone 700 P/E cycles and stores frequently updated data, the wear level manager can relocate the static data to Block 4 so that block wear is balanced.

In memory sub-systems that group blocks into superblocks (e.g., blocks from different planes within a die), such as the SSD, the wear level manager can be programmed to track a wear level (e.g., the number of P/E cycles) of each block of one or more superblocks. The wear level manager is configured/programmed to maintain similar wear levels across the blocks in a superblock, and if one block of a superblock is heavily worn (e.g., at or near a block wear limit corresponding to the P/E cycle count limit), that block can be replaced by a reserved block with a comparable wear level (e.g., a same or similar amount of P/E cycles).

A block wear limit refers to a maximum number of P/E cycles that a memory block in a memory device can undergo before that memory block becomes unreliable. By way of example, if a superblock contains four blocks with P/E cycles of 500, 510, 520, and 900, and a block wear limit is 1,000 P/E cycles, the wear level manager can replace the block with 900 P/E cycles, as that memory block is nearing the block wear limit, with a reserved block that has a P/E cycle count closer to the other blocks, such as a reserved block with around 500 P/E cycles.

Memory sub-systems (e.g., SSDs) are configured with spare or reserved blocks (also known as replacement blocks) to replace worn-out blocks. Blocks that are available for reading and writing operations can be referred to as active blocks, whereas blocks that are to be used to replace worn-out active blocks can be referred to as reserved blocks. The wear level manager can manage and track a wear of reserved blocks and cycle the reserved blocks.

The wear level manager can cycle the reserved blocks so that these blocks are worn evenly before being used as replacements (e.g., experience a similar or same number of P/E cycles as the active blocks). For instance, if a given active block in a superblock has reached a block wear limit, the wear level manager selects a reserved block with a similar or same P/E cycle count as other active blocks in the superblock that have not yet reached the block wear limit. The selected reserved block is then brought into active use (e.g., made available for storing data and thus becomes an active block) while the given block (the worn-out block) is retired.

In some instances, wear leveling is implemented in cooperation with garbage collection. Garbage collection can be used to reclaim space from memory blocks containing invalid or obsolete data. During garbage collection, the wear level manager selects reclaimed blocks in a manner that balances (distributes) wear levels across memory blocks. For example, if blocks with 1000 P/E cycles are chosen for garbage collection, the memory controller (the wear level manager) can move data to blocks with 500 P/E cycles so that block wear is balanced.

Dies that are used in memory sub-systems are fabricated on a wafer. A wafer refers to a semiconductor material (e.g., silicon material) on which multiple dies that are to be used in memory devices are fabricated. Each die on the wafer can contain memory cells that can be organized into structures, such as planes, blocks, and pages, as described herein. Once the wafer is processed (e.g., cut), the dies can be assembled into packages to form memory devices. The memory devices can then be used in storage systems such as SSDs.

During the fabrication of dies that are used in memory sub-system, such dies can have different physical characteristics due to process variations. For example, during fabrication, the dies are fabricated on a wafer and because of process variations these dies can have variations in physical characteristics and some dies can be more prone to defects than others. For example, variations in a manufacturing process can affect a quality of a die and, consequently, a uniformity of wear that can be experienced by memory blocks across those dies.

Manufacturing variations can stem from differences in materials, environmental conditions during fabrication or imperfections (e.g., issues in the lithography process). Dies located near a wafer's edges can exhibit poorer performance and a higher susceptibility to defects than those located away from the wafer's edges. This can result in lower read window margins and an increased likelihood of encountering grown bad blocks (GBBs) over a memory device's lifespan. A lower read window margin indicates a reduced voltage range (read voltage window) used for differentiating between various data states stored in memory cells of these blocks.

Thus, since blocks in a superblock can originate from different planes or dies, block wear characteristics can be influenced by physical characteristics of the underlying dies. As the wear level manager replaces worn-out blocks (or retired blocks) with reserved blocks, the wear level manager wears replacement blocks so that the replacement blocks exhibit same or similar wear characteristics as active blocks of a superblock.

The wear level manager artificially adds wear to one or more reserved blocks to match the wear of active blocks (non-reserved blocks) in the superblock. The term "match," refers to adjusting a wear level (e.g., P/E cycles) of a reserved (replacement) block to be comparable to an average wear level of active blocks in the superblock that are not approaching a wear limit. The wear level manager artificially adds P/E cycles to the reserved block until a wear level of the reserved blocks matches a wear level of active blocks, ensuring consistent wear distribution across the superblock.

To match a reserved block to the active blocks, the wear level manager artificially adds wear to the reserved block by performing P/E cycles until the reserved block reaches a wear level comparable to the active blocks that are not near a wear limit. For example, if there are blocks with different wear levels, such as 500, 510, 520, and 900 P/E cycles, the wear level manager can average the P/E cycles of lower-worn blocks (in this case, around 500-520 cycles) rather than the block with 900 cycles, which is nearing the wear limit. A lower-worn block refers to a memory block that has undergone fewer P/E cycles, meaning that the memory block has less wear and more remaining lifespan compared to one or more other memory blocks. An upper-worn block, by contrast, has experienced a higher number of P/E cycles in comparison to a lower-worn block, indicating that this block is closer to a wear limit.

Using wear leveling to artificially add wear to reserved blocks introduces performance overhead in memory subsystems like SSDs. For example, the memory controller spends time cycling these reserved blocks, which consumes resources that would otherwise be used for active memory tasks such as reading and writing data. This reallocation of resources can lead to a temporary decrease in overall throughput, reducing a system's performance during those periods.

Furthermore, the use of reserved block wear leveling increases a firmware complexity of the memory controller, as the memory controller needs to manage wear leveling across both active and reserved blocks, track wear levels across all of these blocks, and schedule replacement cycles. The memory controller needs to balance reserved block cycling with regular operations to prevent memory device performance degradation so that the replacement blocks are ready to be used when needed. Consequently, managing and tracking wear levels of reserved blocks adds to firmware's wear leveling algorithm complexity, requiring more sophisticated tracking and decision-making processes, which impacts memory sub-system performance (e.g., handling of host requests/commands).

In some memory sub-system implementations, memory controller firmware (e.g., SSD firmware) is configured/programmed to utilize an idle time to execute program and erase operations on reserved blocks (e.g., cycling of reserved blocks) so that an impact on memory sub-system performance is minimal (reduced). By performing cycling operations during periods when the memory sub-system is not actively handling host requests, an overall performance impact on the memory sub-system (e.g., the SSD) is curtailed.

In some other memory sub-system implementations, the memory controller firmware (e.g., the SSD firmware) is configured/programmed to only erase the reserved blocks to curtail (mitigate) an impact on memory sub-system performance from cycling reserved blocks. Such implementations avoid the additional resource consumption associated with programming data into reserved blocks; however, this results in the replacement blocks not aging properly (e.g., due to a lack of a programming operation). Without being subjected to programming cycles, the reserved blocks do not experience a same or similar wear pattern as active blocks these reserved blocks are intended to replace. Consequently, when these replacement blocks are utilized, these blocks can exhibit a mismatch in wear characteristics compared to the active blocks. A mismatch in wear characteristics can lead to performance imbalances or premature failure of the replacement blocks.

In yet some memory sub-system implementations, the memory controller firmware (e.g., SSD firmware) is configured without bad block replacement functionality. Managing wear leveling for both active and reserved blocks, such as in multi-die configurations, can make it challenging to achieve consistent wear leveling without introducing performance trade-offs. As a result, some memory subsystems are configured not to replace bad blocks (e.g., GBBs) and instead rely on alternative error correction mechanisms to maintain data integrity, although such alternative approaches can compromise the long-term reliability of the memory device.

Example systems and methods are described herein for proactive cycling of reserved blocks using die wafer location data. Proactive cycling refers to a process of adding wear to reserved blocks of high-risk dies by performing P/E cycles before these reserved blocks are activated (or needed) as replacements for retired blocks. Reserved blocks of dies that are likely more prone to defects (known as high-risk dies herein) are cycled more frequently, whereas reserved blocks of dies that are likely less susceptible to defects (known has low-risk dies herein) can be cycled less frequently or, in some instances, not cycled at all (or cycled for a limited number of cycle operations).

For example, the memory sub-system can proactively cycle reserved blocks from dies that are more susceptible to defects during fabrication using the die wafer location data so that these reserved blocks are adequately aged and exhibit wear characteristics similar to those of active blocks before being activated as replacements for retired blocks. For example, a memory controller of the memory sub-system (e.g., an SSD) can employ a reserved block cycler, as described herein.

The memory controller uses the die wafer location data to identify high-risk dies (e.g., one or more dies of the memory sub-system more likely prone to defects) to proactively manage a wear level of reserved blocks within these high-risk dies. Selectively cycling reserved blocks in dies that are at a higher risk of encountering GBBs during a memory sub-system's lifetime reduces a likelihood that the performance of the memory sub-system is degraded. Thus, by proactively managing the wear of reserved blocks of high-risk dies, the memory sub-system can curtail performance impacts associated with the use of high-risk dies in such systems, which are more likely to fail early in a memory devices lifetime.

Accordingly, configuring the memory controller with the reserved block cycler allows the memory controller to prioritize the cycling of reserved blocks of high-risk dies over reserved blocks of low-risk dies. By prioritizing cycling of reserved blocks of high-risk dies over low-risk dies, unnecessary cycling of reserved blocks from more reliable dies (the low-risk dies) is minimized, thereby reducing an impact on memory sub-system performance as only a limited set of reserved blocks of all reserved blocks of the memory sub-system is cycled. Consequently, resources for active memory operations are available at the memory controller, which can reduce performance slowdowns by limiting cycling activities to high-risk dies while maintaining system resources for tasks such as reading and writing data.

Furthermore, in memory sub-system implementation that forgoes block replacement, such memory sub-systems can be updated (e.g., via a firmware update) to incorporate the reserved block cycler so that memory blocks of worst-performing dies (the high-risk dies) can be proactively cycled. This allows such memory sub-systems to gain additional endurance (e.g., withstand more P/E cycles over its lifetime) and increases an amount of data that can be written to the memory sub-system over time, thereby extending a useful life of the most defect-prone dies (e.g., high-risk dies) and the memory sub-system overall.

FIG. 1 illustrates an example computing system 100 that includes a memory sub-system 110 in accordance with some examples of the present disclosure. The memory sub-system 110 can include media, such as one or more volatile memory devices (e.g., memory device 140), one or more non-volatile memory devices (e.g., memory device 130), or a combination of such. The memory sub-system 110 can be a storage device, a memory module or a hybrid of a storage device and a memory module. Examples of a storage device include an SSD, a flash drive, a universal serial bus (USB) flash drive, an embedded Multi-Media Controller (eMMC) drive, a Universal Flash Storage (UFS) drive, a secure digital (SD) card and a hard disk drive (HDD). Examples of memory modules include a dual in-line memory module (DIMM), a small outline DIMM (SO-DIMM) and various types of non-volatile dual in-line memory modules (NVDIMMs).

The system 100 can be a computing device such as a desktop computer, laptop computer, network server, mobile device, a vehicle (e.g., airplane, drone, train, automobile or other conveyance), Internet of Things (IoT) enabled device, embedded computer (e.g., one included in a vehicle, industrial equipment or a networked commercial device) or such computing device that includes memory and a processing device. The system 100 can include a host system 120 that is coupled to one or more memory sub-systems 110. In some examples, the host system 120 is coupled to different types of the memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller) and a storage protocol controller (e.g., PCIe controller, SATA controller, CXL controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a compute express link (CXL) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface, or any other interface.

The physical host interface can be used to transmit data between the host system 120 and the memory sub-system 110. The host system 120 can further utilize an NVM Express (NVMe) interface to access the memory components (e.g., memory device(s) 130) when the memory sub-system 110 is coupled with the host system 120 by the physical host interface (e.g., a PCIe or CXL bus). The physical host interface can provide an interface for passing control, address, data and other signals between the memory sub-system 110 and the host system 120. FIG. 1 illustrates a memory sub-system 110 as an example. In general, the host system 120 can access multiple memory sub-systems via a same communication connection, multiple separate communication connections and/or a combination of communication connections.

The memory device 130 and the memory device 140 are implemented as non-transitory computer readable media. The memory device 130 and the memory device 140 can include any combination of the different types of non-volatile memory devices and/or volatile memory devices. The volatile memory devices (e.g., the memory device 140) can be, but are not limited to, random access memory (RAM), such as dynamic random access memory (DRAM) and synchronous dynamic random access memory (SDRAM).

Some examples of non-volatile memory devices (e.g., memory device(s) 130) include NAND type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-OR (NOR) flash memory, electrically erasable programmable read-only memory (EEPROM), etc.

In some examples, a non-volatile memory device is a package of one or more dies. For example, the memory device(s) 130 and 140 can include one or more dies 142-144. The dies 142-144 can be assigned to one or more channels for communicating with the controller 115. While two dies are shown in the example of FIG. 1, in other examples, the memory device 130 or 140 can include more or less dies. Each die of the dies 142-144 can consist of one or more planes. For example, the die 142 can include planes 146-152 and the die 144 can include planes 166-172. While four planes are shown per die of the dies 142-144 in the example of FIG. 1, in other examples, the dies 142-144 can include more or less planes. Planes can be grouped into logic units (LUN).

For some types of non-volatile memory devices (e.g., NAND memory devices), each plane 146-152 and 166-172 can consist of a set of physical blocks, which are groups of memory cells for storing data. For example, each of the planes 146-152 and 166-172 of the memory device(s) 130 and 140 can include one or more memory blocks (for simplicity blocks). Each block can include memory cells (also referred to as cells). A cell is an electronic circuit that stores information. In some examples, the memory blocks include pages that can store all or a portion of the memory cells. For example, each page of each memory block can include a group of memory cells.

In some instances, the memory cells of the memory devices 130 and 140 can be grouped as pages, which can refer to a logical unit of the memory device used to store data. In some types of memory (e.g., NAND), memory blocks can be formed of multiple pages and each of the pages can include a portion of memory cells of the memory cells. The memory devices 130 and 140 are structured to include wordlines. Wordlines are addressable wiring lines that connect and control a row of memory cells (of a respective page) in the memory devices 130 and 140. Each wordline addresses one or more cells of each of the dies 142-144 in a corresponding row contemporaneously, enabling operations such as reading, writing and erasing data.

The memory cells of the dies 142-144 can store bits (corresponding to logic states). A logic state stored at a cell correlates to a number of bits being stored. Each logic state can be represented by binary values, such as "0" and "1", or combinations of such values. One type of memory cell, for example, SLC can store one bit per cell. Other types of memory cells, such as MLCs, TLCs, QLCs, PLCs and higher order memory cells, can store multiple bits per cell. In some examples, each of the memory devices 130 and 140 can include one or more arrays of memory cells such as SLCs, MLCs, TLCs, QLCs, PLCs or some combination thereof. In some examples, a particular memory device can include an SLC portion, an MLC portion, a TLC portion, a QLC portion and/or PLC portion of memory cells.

In some examples, the memory blocks within the planes 146-152 and 166-172 can be further organized into superblocks 132-138. A superblock is a logical grouping of memory blocks, typically formed by selecting one block from each plane within a die or across multiple dies. Grouping blocks into superblocks across planes allows for parallel operations, such as programming and erasing, across multiple planes at the memory devices 130 and 140. For example, in the memory devices 130 and 140, each superblock 132-138 can logically include one or more memory blocks from one of the planes 146-152 of the die 142 and one of the planes 166-172 of the die 144.

To perform operations such as reading, writing or erasing data at the memory devices 130 and 140 and other such operations, a memory sub-system controller 115 (or controller 115 for simplicity) communicates with the memory device(s) 130 and 140. The memory sub-system controller 115 can include hardware such as one or more integrated circuits and/or discrete components, a buffer memory or some combination thereof. The hardware can include a digital circuitry with dedicated (e.g., hard-coded) logic to perform the operations described herein. The memory sub-system controller 115 can be a microcontroller, special purpose logic circuitry (e.g., a field programmable gate array (FPGA), an application specific integrated circuit (ASIC), etc.) or other suitable processor.

The memory sub-system controller 115 can include a processing device, which includes one or more processors (e.g., the processor 117), configured to execute instructions stored in a local memory 119. In the illustrated example, the local memory 119 of the memory sub-system controller 115 includes an embedded memory configured to store instructions for performing various processes, operations, logic flows and routines that control operation of the memory sub-system 110, including handling communications between the memory sub-system 110 and the host system 120. The local memory 119 is a non-transitory computer-readable medium.

In some examples, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another example, a memory sub-system 110 does not include a memory sub-system controller 115 and can instead rely upon external control (e.g., provided by an external host, or by a processor or controller separate from the memory sub-system).

The memory sub-system controller 115 can receive commands from the host system 120, which can be referred to as host commands. The controller 115 can convert the host commands into instructions or appropriate commands to achieve a desired access to the memory devices 130, such as reading, writing, and/or erasing data. The memory sub-system controller 115 can be responsible for other operations such as wear leveling operations, garbage collection operations, error detection and ECC operations, encryption operations, caching operations and address translations between a logical address (e.g., a logical block address (LBA), namespace) and a physical address (e.g., physical block address (PBA)) that are associated with the memory devices 130 and 140.

The memory sub-system controller 115, for example, can employ a Flash Translation Layer (FTL) to translate logical addresses to corresponding physical memory addresses, which can be stored in one or more FTL mapping tables. In some instances, the one or more FTL mapping tables can be referred to as a logical-to-physical (L2P) mapping table and can store L2P mapping information. An L2P mapping table maps LBAs to PBAs on a page or block level. The memory sub-system controller 115 can further include host interface circuitry to communicate with the host system 120 via the physical host interface. The host interface circuitry can convert the host commands received from the host system 120 into command instructions to access the memory devices 130 as well as convert responses associated with the memory devices 130 into information for the host system 120.

The memory sub-system 110 can also include additional circuitry or components that are not illustrated. For example, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some examples, the memory devices 130 and 140 include local media controllers 135 that operate in concert with the memory sub-system controller 115 to execute operations on one or more memory cells of the memory devices 130 or 140. An external controller (e.g., the memory sub-system controller 115) can externally manage the memory device 130 (e.g., perform media management operations on the memory device 130). In some examples, the memory sub-system 110 is a managed memory device, which is a raw memory device 130 having control logic (e.g., local media controller 135) on the die and a controller (e.g., the memory sub-system controller 115) for media management within the same memory device package. An example of a managed memory device is a managed NAND (MNAND) device.

In some examples, the controller 115 executes an error corrector that executes error-handling of data read from the memory device 130 and/or the memory device 140. In operation, the host system 120 manages and controls the flow of data between itself and the memory sub-system 110, facilitating efficient data storage and retrieval operations. More generally, the host system 120 employs the memory sub-system 110 to write data to and read data from the memory sub-system 110, as well as to erase the data. For instance, the host system 120 processes these requests for reading and/or writing data by interacting with the memory sub-system 110, managing the flow of data to and from the memory device 130 and/or the memory device 140 within the memory sub-system 110. This reading and writing of data enables operation of computing systems where data access and management are needed.

In some examples, the controller 115 includes a memory block manager 108 to monitor a health of memory blocks. The memory block manager 108 is used to detect or identify GBBs (growing bad blocks). The controller 115 can monitor the memory device 130 and/or 140 for bad blocks (e.g., GBBs) at a superblock level. Each memory block in each of the superblocks 132-138 can undergo a number of P/E cycles (for simplicity referred to herein as cycles) over a block lifetime. The memory controller 115 can keep track of how many cycles each block within each of the superblocks 132-138 undergoes over time. By way of example, referred to herein as a first example, the memory device 130 includes 8 dies and each die has 4 planes. In this example, Superblock 0 can consist of Block 0 from Plane 0 of Die 0, Block 0 from Plane 1 of Die 1, and so on. In the first example, Superblock 0 can have 32 physical blocks if there are 8 dies and 4 planes per die. In some instances, in the first example, if Superblock 0 is programmed and/or erased 50 times, each block within that superblock will have gone through about 50 P/E cycles.

In some examples, the memory controller 115 (the memory block manager 108) tracks a number of P/E cycles each block of the superblocks 132-138 has gone through by maintaining a block-level counter for each of these blocks. The memory block manager 108 reads and updates this counter for a memory block every time the memory controller 115 performs a program and/or erase operation on that block. For instance, in the first example, the memory controller 115 increments the P/E cycle counters for each of the 32 blocks by one after a program and/or erase operation.

In some examples, the memory controller 115 can maintain a superblock-level counter for each of the superblocks 132-138. A superblock-level counter is updated by the memory block manager 108 in response to an associated superblock being programmed and/or erased (cycled). For instance, in the first example, if Superblock 0 is programmed and/or erased 50 times, the superblock-level counter can be set to 50 for that superblock.

In some examples, the memory controller 115 executes a wear level manager 113 to balance a wear across superblocks 132-138 so that these superblocks have a same or similar wear level (e.g., same or similar number of P/E cycles). For example, the wear level manager 113 can implement a wear leveling process with respect to active (or primary) blocks (blocks that are available for use in storing user data), which can be referred to as an active wear leveling process. The active wear leveling process can be implemented at a block or superblock level by the wear level manager.

For example, during the active wear leveling process, the memory controller 115 can balance P/E cycle counts for the superblocks 132-138 to reduce a likelihood that any single superblock of the superblocks 132-138 wears out faster than others. The wear level manager 113 can manage and distribute P/E cycles across the superblocks 132-138 so that P/E cycle counts for these superblocks 132-138 are same or similar in P/E cycle count value. For instance, in the first example, if Superblock 1 has undergone 100 P/E cycles and Superblock 2 has undergone 50 P/E cycles, the memory controller 115 can prioritize writes to Superblock 2 in subsequent write operations to balance the wear across the superblocks over time.

In some examples, during the active wear level process, the wear level manager 113 can monitor (track) how many P/E cycles counts each memory block of each of the superblocks 132-138 has undergone. The wear level manager 113 can track P/E cycles at a superblock level using super-block level counters. The wear level manager 113 can analyze the P/E cycle counts of the superblocks 132-138 to determine whether the superblocks 132-138 are experiencing a same or similar wear (e.g., have a similar or same number of P/E cycles). If some superblocks, as an example, the superblock 132, have significantly higher cycle counts than others (e.g., exceeds a cycle count threshold), the wear level manager 113 can identify these superblocks.

For example, in response to determining that the superblock 132 has a higher P/E cycle count relative to the other superblocks 134-138, the wear level manager 113 can instruct the controller 115 to prioritize the superblocks 134-138 for future write operations, which have undergone fewer P/E cycles. Thus, during subsequent write operations, the memory controller 115 can redirect data that may have been written to a more heavily worn superblock (e.g., the superblock 132) to less worn superblocks (one or more of the superblocks 134-138).

In some examples, the wear level manager 113 can implement a wear leveling process with respect to reserved blocks, which can be referred to as a reserved wear leveling process. Thus, in some examples, the wear level manager 113 can be programmed/configured to manage a wear leveling of replacement (reserved) blocks and the active memory blocks of the superblocks 132-138. In NAND memory systems, such as the memory sub-system 110, when an active block within a superblock becomes a GBB (e.g., due to extensive wear or defects), the memory controller 115 can replace that block, which can be referred to as a bad block with a replacement block. So that the replacement block integrates into the superblock without causing performance issues or early failure, the replacement block can undergo a number of P/E cycles so that the replacement block has a same or similar number of P/E cycles as other active blocks of that superblock.

For example, the wear level manager 113 can employ a reserved block cycler 123. During the reserved wear leveling process, the reserved block cycler 123 can cycle one or more replacement blocks of one or more high-risk dies. These replacement blocks are intended to substitute one or more bad blocks in the future. By cycling the replacement blocks ahead of time, these replacement blocks can achieve comparable wear characteristics to the active blocks these blocks are to replace within the superblock. The reserved wear leveling process serves as a proactive wear management strategy and involves pre-cycling the replacement blocks by selectively programming and/or erasing the replacement blocks over time, even if these blocks are not yet in active use. The reserved wear leveling process can be used to align the P/E cycle counts of the replacement blocks with those of active blocks in the superblock that these replacement blocks may eventually replace.

By way of example, in the first example, if the blocks in Superblock 1 have undergone 100 P/E cycles, and one of those blocks becomes a GBB, the memory controller 115 can select (identify) a replacement block for taking that GBB's position. The wear level manager 113 manages a wear level of the replacement block in the first example so this block has a cycle count close to 100 P/E cycles. The selected replacement blocks can have a same or similar wear distribution (e.g., a number of P/E cycles) as Superblock 1 in the first example. In some examples, the wear level manager 113 tracks a wear of reserved replacement blocks in a same or similar manner as the wear level manager 113 tracks primary blocks within superblocks 132-138.

The controller 115 (using the memory block manager 108) can continuously monitor the health of the superblocks 132-138 (or in some instances, individual memory blocks of the superblocks) to detect issues that may compromise block reliability. For example, the memory block manager 108 can evaluate various indicators, such as P/E cycle counts (e.g., block-level and/or superblock-level counter values) and/or error rates to assess memory block health (e.g., at a superblock or memory block level). A failure at a memory block may be determined by the controller 115 based on one or more parameters, including when a P/E cycle count for a block is approaching or exceeding a predefined threshold, or when the block exhibits a high number of read/write errors beyond an acceptable threshold.

In some examples, the memory block manager 108 utilizes counter values to assist in detecting potential failures. Each block can have an associated block-level counter value (e.g., P/E cycle counter value), which tracks the number of times that a block has been programmed and/or erased. The controller 115 can compare the block-level counter value for each block to a P/E cycle threshold. If the block-level counter value exceeds the P/E cycle threshold, the memory block manager 108 can flag the block as potentially unreliable corresponding to a GBB. Upon detecting a potential failure based on counter values, the memory controller 115 can take corrective actions, such as initiating a block replacement process, where a faulty block (also known as a bad block or GBB) is replaced with a reserved (replacement) block from a same die and plane.

In some examples, the memory controller 115 (through the memory block manager 108) initiates the block replacement process when the controller 115 detects (determines) that a memory block, such as an active block 182 (identified as "AB 182" in FIG. 1) of active blocks of the superblock 132, is unreliable or has failed. During the block replacement process, the memory controller 115 replaces the active block 182 (the GBB or bad block) with a reserved (replacement) block 184 (identified as "RB 184" in FIG. 1) of reserved blocks from a same die (the die 142) and plane (the plane 146).

For example, the reserved block 184 can be selected by the memory block manager 108 from a set of reserved blocks of the die 142 that has same or similar wear characteristics (e.g., the same or similar number of P/E cycles) to other active blocks in the superblock 132. The selection can be based on the average P/E cycle value, which can be computed by averaging P/E cycle values of the lower-worn active blocks in the superblock 132. The lower-worn active blocks correspond to remaining active blocks in the superblock 132 that have not been identified as bad or faulty blocks. Thus, the memory block manager 108 can select the reserved block 184 based on the average P/E cycle value. The memory controller 115 can remap the faulty block (the active block 182 in some examples) to this reserved block (the reserved block 184) by updating a block mapping table (BMT) so that future read and write operations to the faulty block are redirected to the replacement block (the reserved block 184).

In some examples, after the replacement block (the reserved block 184) is selected, the controller 115 can transfer the data from the faulty block (if the active block 182 can still be read) to the reserved block 184. If the data is unreadable due to severe degradation, the controller 115 can attempt to recover the data using error correction mechanisms before writing the data to the reserved block 184. Once the block replacement process is complete, the controller 115 continues normal operation, and the replaced block (the active block 182) is retired (becomes a retired block) and excluded from future operations. In some examples, an active block 186 (identified as "AB 186" in FIG. 1) of active blocks on the die 144 can become a bad block (e.g., GBB), and the controller 115 can replace the active block 186 with a reserved block 188 (identified as "RB 188" in FIG. 1) of reserved blocks on the die 144 in a same or similar manner, as described herein.

Figure 2:
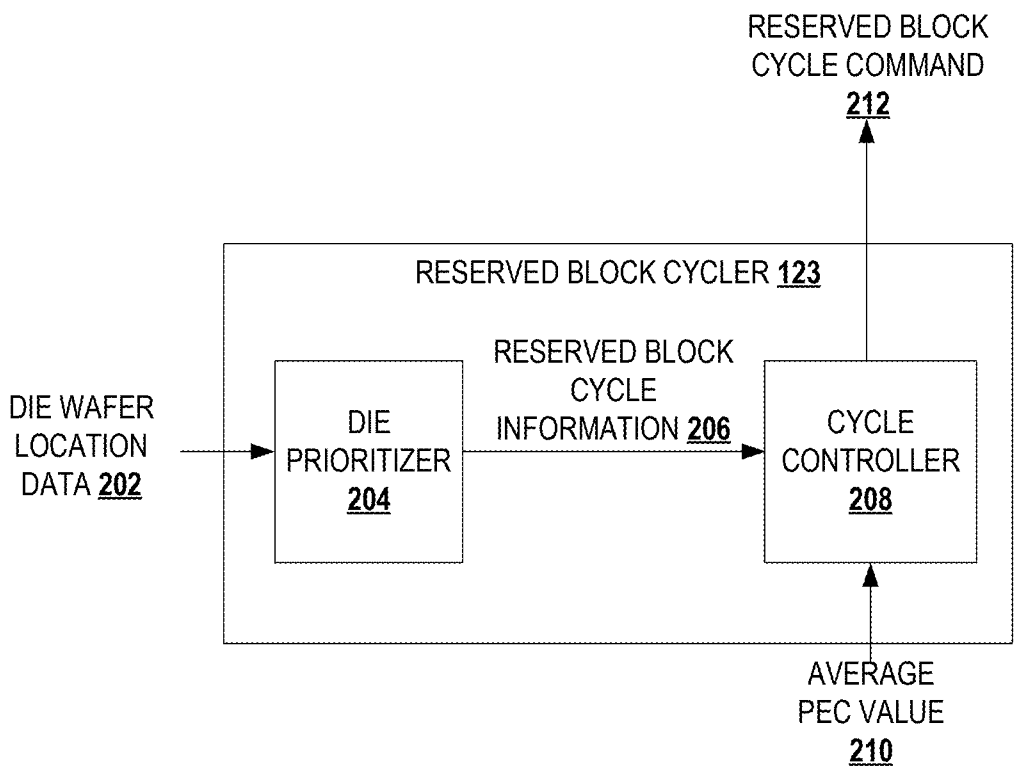
FIG. 2 is an example of a reserved block cycler of a memory sub-system of the computing system of FIG. 1.

In some examples, the reserved block cycler 123 can cycle (wear) one or more replacement blocks of the dies 142-144 based on die wafer location data 202, as shown in FIG. 2. The die wafer location data 202 can include a die location failure value for each die, such as the dies 142-144 of FIG. 1, which are under wear level management of the memory controller 115. While the example of FIG. 1 illustrates the reserved block cycler 123 being implemented as part of the memory block manager 108, in other examples, the reserved block cycler 123 can be implemented as a stand-alone module, or as part of the wear level manager 113.

FIG. 2 is an example of the reserved block cycler 123 of FIG. 1. The reserved block cycler 123 can be implemented using one or more modules, shown in block form in the drawings. The one or more modules can be in software or hardware form, or a combination thereof. In some examples, one or more functions of the reserved block cycler 123 can be implemented as machine readable instructions for execution by the controller 115, as shown in FIG. 1.

The die wafer location data 202 can be stored in the local memory 119 of FIG. 1. The die wafer location data 202 can be provided based on probe data collected during a manufacturing process of memory dies, such as the memory dies 142-144 that are used in the memory sub-system 110. For example, the probe data can be collected during the manufacturing process, where measurements and tests can be conducted to assess physical characteristics of the dies, including the dies 142-144, at various locations on a wafer (also can be referred to as a memory wafer). The probe data can include information, such as defectivity information, wafer warping measurements, die thickness variations, and other process variation information that can impact a reliability and performance of the dies.

Figure 3:
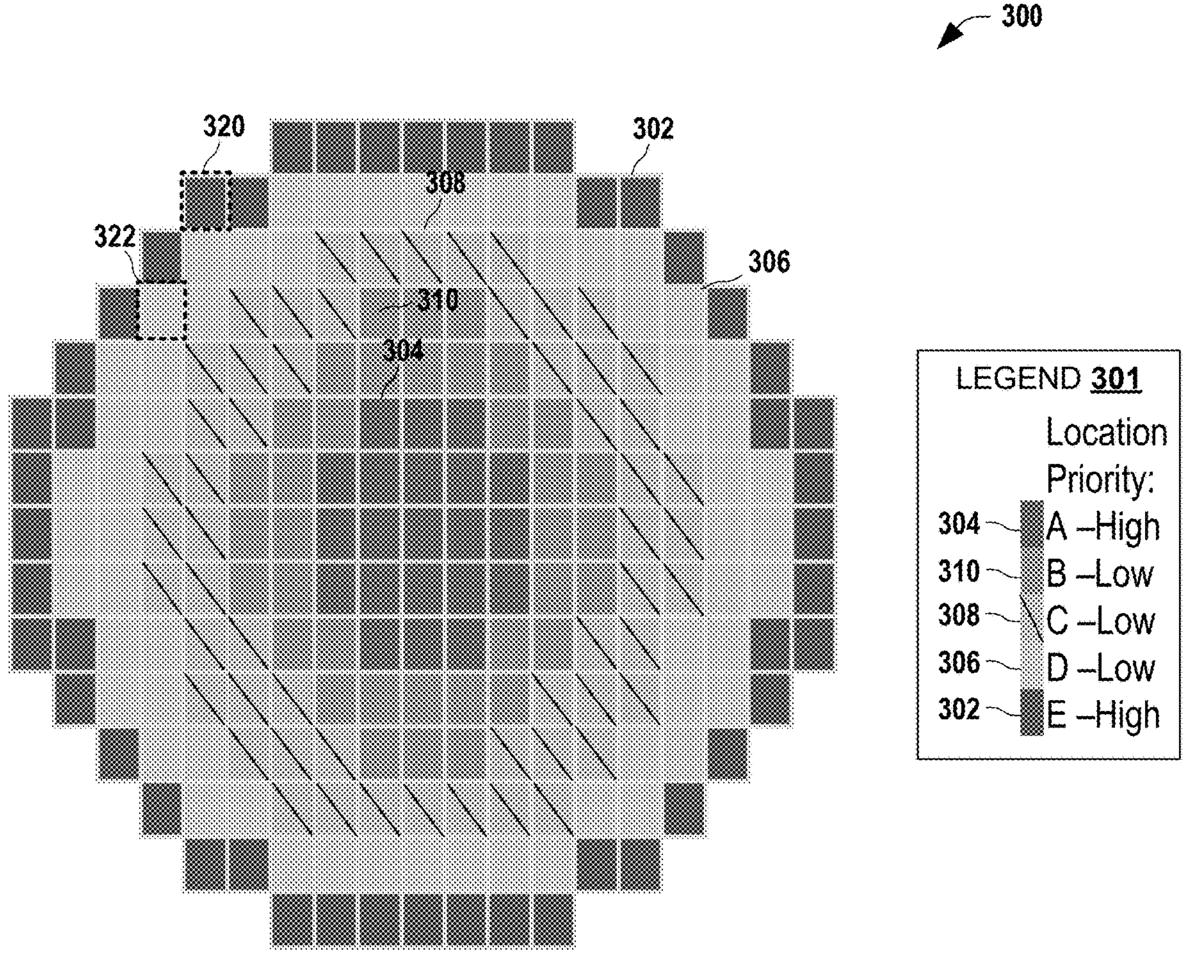
FIG. 3 is an example of a graphical representation of dies on a wafer with assigned die location failure values in accordance with some examples of the present disclosure.

The probe data can be used to assign each die of the wafer a die location failure value to generate the die wafer location data 202. A die location failure value refers to a numerical or categorical value that can be assigned to a memory die that indicates a likelihood of die failure during operation of the memory devices 130 and 140 based on a location of a respective die on a wafer, such as wafer 300. FIG. 3 is an example of a graphical representation of the wafer 300 with dies assigned die location failure values using a color coding scheme, as indicated by a legend 301. In the example of FIG. 3, each die, including the dies 142-144 of FIG. 1, is represented as a block. For example, a block 320 in FIG. 3 can represent the die 142 of FIG. 1 and a block 322 in FIG. 3 can represent the die 144 of FIG. 1.

In the examples herein, dies that are more likely to experience a die failure can be referred to as high-risk dies. In the example of FIG. 3, high-risk dies have a higher assigned die location failure value. An example of a die failure can include a GBB or a failure of multiple memory blocks within the die due to physical defects or process variations. These failures can arise from factors such as excessive P/E cycles, high error rates or cell degradation over time. A die failure can manifest as a block becoming unable to reliably store data or frequent read/write errors occurring in one or more blocks of that die. For example, dies that are prone to defects or located in areas of the wafer 300 with higher defectivity rates can cause memory blocks within those dies to degrade more quickly. This could lead to early failures or performance degradation of the memory blocks as the die wears out at a faster rate.

FIG. 3 illustrates dies of the wafer 300 assigned die location failure values that indicate a likelihood of die failure during operation of the memory devices 130 and 140 based on a location of a respective die on the wafer 300. A likelihood of die failure refers to a probability or risk that a memory die will experience functional degradation or complete failure over time due to one or more factors, such as described herein based on a location of that memory die on a wafer. These factors can include defects introduced during manufacturing, environmental conditions, excessive P/E cycles, and physical characteristics like wafer location, thickness variations, or defectivity. For example, a higher likelihood indicates that a die is more prone to wear out or encounter errors, leading to potential reliability issues or failure during operation.

For example, in the example of FIG. 3, a first set of dies 302 of the wafer 300 can be assigned a die location failure value "A", a second set of dies 310 of the wafer 300 can be assigned a die location failure value "B", a third set of dies 308 of the wafer 300 can be assigned a die location failure value "C", a fourth set of dies 306 of the wafer 300 can be assigned a die location failure value "D", and a fifth set of dies 304 of the wafer 300 can be assigned a die location failure value "E".

Each of the first, second, third, fourth and fifth set of dies 302-310 can be identified in the example of FIG. 3 with a unique (different) color to indicate its die location failure value. A die location failure value assigned to each die of the wafer 300 can be based on characteristics of the wafer 300, such as the probe data. By way of example, the first and fifth sets of dies 302-304 in the example of FIG. 3 can be referred to as high-risk dies and the second, third, fourth, and fifth sets of dies 306-310 can be referred to as low-risk dies.

High-risk dies correspond to dies of the wafer 300 that have been assigned a higher likelihood of failure (a higher die location failure value). Thus, one or more active blocks of high-risk dies can be referred to as high-risk (active) blocks. Memory blocks of high-risk dies within these dies are more likely to degrade or fail earlier. Low-risk dies correspond to dies of the wafer 300 that have been assigned a lower likelihood of failure (a lower die location failure value). Thus, one or more active blocks of low-risk dies can be referred to as low-risk (active) blocks. Lower-risk dies exhibit fewer defects and can be located in regions of the wafer 300 that can experience more consistent processing conditions. Memory blocks within low-risk dies can have greater reliability and slower wear rates when compared to high-risk dies and thus low-risk dies can require less frequent cycling (or no cycling at all) compared to high-risk dies.

As described herein, the die wafer location data 202 can indicate a die location failure value for each die, such as the dies 142-144. In some examples, the die 142 is assigned the die location failure value "A" and can be referred to as a high-risk die, whereas the die 144 is assigned the die location failure value "D" and can be referred to as a low-risk die. As described herein, the block 320 in FIG. 3 can represent the die 142 and the block 322 in FIG. 3 can represent the die 144.

For example, the reserved block cycler 123 can retrieve or receive the die wafer location data 202 from the local memory 119. The reserved block cycler 123 includes a die prioritizer 204. In some examples, in response to the memory sub-system 110 initializing (e.g., being powered on), the die prioritizer 204 can retrieve the die wafer location data 202 from the local memory 119. The die prioritizer 204 can use the die wafer location data 202 to assign each of the dies 142-144 a die location failure value to provide reserved block cycle information 206 to a cycle controller 208 of the reserved block cycler 123. The reserved block cycle information 206 can indicate or identify which reserved blocks of a die of the memory sub-system 110 are to be cycled.

For example, the die 142 can have a higher die location failure value than the die 144 based on the die wafer location data 202. The die location failure value for each of the dies 142-144 can be used by the memory controller 115 to prioritize cycling of reserved blocks of the dies 142-144 as part of wear leveling operations. Thus, in some examples, high-risk dies, such as the die 142, which are more prone to defects (as indicated by the die wafer location data 202), can be assigned a higher die location failure value by the memory controller 115. Replacement blocks from these high-risk dies (e.g., the reserved block 184) can be proactively cycled to ensure that, in the event of a failure, these replacement blocks exhibit similar wear characteristics as other active blocks from that die. Accordingly, the die location failure value assigned to each die can determine which reserved blocks are to undergo proactive cycling and which reserved blocks of which die are not to be cycled (or cycled for a limited number of cycling iterations).

The die prioritizer 204 can output the reserved block cycle information 206 in response to assigning each die of the dies 142-144 a die location failure value based on the die wafer location data 202. For dies assigned a high die location failure value, such as the die 142, the die prioritizer 204 can provide the reserved block cycle information 206 identifying one or more reserved blocks of that die (e.g., the reserved block 184). In some examples, the reserved block cycle information 206 can be stored in the local memory 119 of FIG. 1.

In some examples, the reserved block cycler 123 includes the cycle controller 208. The cycle controller 208 can utilize an average superblock cycle count value 210 (also referred to as an average P/E count (PEC) value 210, as shown in FIG. 2), to determine whether the reserved blocks identified in the reserved block cycle information 206 should be cycled. For example, the memory block manager 108 can provide the cycle controller 208 with an average PEC value 210 for the superblocks 132-138. Average PEC count values can be tracked and updated by the memory controller 115 for the superblocks 132-138 in the memory sub-system 110.

For example, the memory controller 115 can sum PEC values for each of the superblocks 132-138 to determine the average PEC value 210. In some examples, the reserved block cycler 123 computes the average PEC value 210. The memory controller 115 can sum the PEC values for each of the superblocks 132-138 to provide a summed PEC value and divide the summed PEC value by a number of superblocks to provide the average PEC value 210. By way of example, if the memory device 130 includes 4 superblocks, and each superblock has the following PEC counts: Superblock 1: 100 PECs, Superblock 2: 120 PECs, Superblock 3: 80 PECs and Superblock 4: 110 PECs, an average PEC count value would be 102.5 (e.g., (100+120+80+110)/4=102.5).

The cycle controller 208 can evaluate the average PEC value 210 and a previously computed PEC value (e.g., in a same or similar manner as the average PEC value 210 computed herein) to determine if there was an average PEC value increase. In response to determining that there was an average PEC value increase, the cycle controller 208 can issue a reserved block cycle command 212. The reserved block cycle command 212 can be used to instruct (e.g., cause) the memory device 130 or 140 to cycle (e.g., level wear) one or more reserved blocks identified by the reserved block cycle information 206.

Thus, the cycle controller 208 can provide the reserved block cycle command 212 identifying replacement blocks that are to be cycled (e.g., programmed and/or erased), which can be referred to as high-priority reserved blocks. Reserved blocks that are not identified for cycling can be referred to as a low-priority reserved blocks. In some examples, replacement blocks of one or more dies of the memory device 130, such as the reserved block 188 of the die 144 that are not identified by the reserved block cycle command 212 are not cycled by the controller 115. In some examples, the cycle controller 208 can provide the reserved block cycle command 212 indicating the number of times that the replacement blocks specified by the reserved block cycle information 206 are to be cycled.

The reserved block cycle command 212 can be used by the wear level manager 113 to cycle (wear) for the number of cycles the reserved blocks of the high-risk dies of the memory device 130 specified by the reserved block cycle information 206. In some examples, the wear level manager 113 continues cycling the reserved blocks until the wear (e.g., the number of P/E cycles) of the reserved blocks is similar to or the same as the average PEC value 210 corresponding to a reserved block cycle stop condition. In some examples, the wear level manager 113 cycles the reserved blocks identified by the reserved block cycle command 212 until the reserved block cycle stop condition. The reserved block cycle stop condition for reserved block cycling can be reached when a P/E cycle count of the reserved blocks is within a predetermined threshold or tolerance range of a P/E cycle count value of an active memory block on the same die as the reserved blocks that are being cycled.

In some examples, the reserved block cycle stop condition for reserved block cycling can be based on an average P/E cycle count value for the active memory blocks on the same die as the reserved blocks specified by the reserved block cycle information 206. For example, the cycling can stop (e.g., the reserved block cycle stop condition can be satisfied) when a P/E cycle count value for each of the reserved blocks is within a predetermined threshold or tolerance range of the average P/E cycle count value of the active blocks. As an example, if the active blocks have an average P/E cycle count of 150, the reserved block cycle stop condition can be defined such that cycling ends when each of the reserved blocks has a P/E cycle count within a specific tolerance range (e.g., within 5%), resulting in a stop range of 142 to 158 cycles.

Accordingly, reserved block cycling is proactively implemented on the high-risk dies by the wear level manager 113 by selectively performing P/E operations on the reserved blocks of the high-risk dies. For example, the memory controller 115 can apply program and/or erase commands to the reserved blocks of each high-risk die identified by the reserved block cycle command 212 to simulate wear conditions that these reserved blocks would experience during normal use, such as active blocks on the same die as the reserved blocks. By executing cycling operations, the reserved blocks of the high-risk dies as identified by the reserved block cycle command 212 are worn at a rate that aligns with (or that matches) active blocks on the same die as the reserved blocks. This ensures that the reserved blocks are ready to be used as replacements when an active block on that die reaches an end of its usable life or becomes a GBB.

By configuring or programming the controller 115 with the reserved block cycler 123, the controller 115 can proactively manage the wear of reserved blocks in the memory sub-system 110. This management is based on the die wafer location data 202, allowing the controller 115 to prioritize cycling reserved blocks of high-risk dies (over low-risk dies). As a result, reserved blocks in these high-risk dies are cycled in advance to align with the wear characteristics of active blocks, which enhances a reliability and performance of the memory sub-system 110.

For example, in the memory sub-system 110, the die 142 can be identified as a high-risk die, and the reserved block 184 can be proactively cycled to ensure the reserved block 184 has wear characteristics that are the same or similar to the active blocks on the die 142. In contrast, the die 144, identified as a low-priority die, in some examples, would not have its replacement blocks, including the reserved block 188, cycled. In some examples, if the active block 186 on die 144 is identified as a bad block (GBB), the reserved block 188 can be cycled to match the wear of the remaining blocks on the die 144. Accordingly, by configuring the controller 115 with the reserved block cycler 123 unnecessary cycling of reserved blocks of dies that may never be used during the system's lifetime is curtailed (minimized), which improves a memory sub-system performance.

Figure 4:
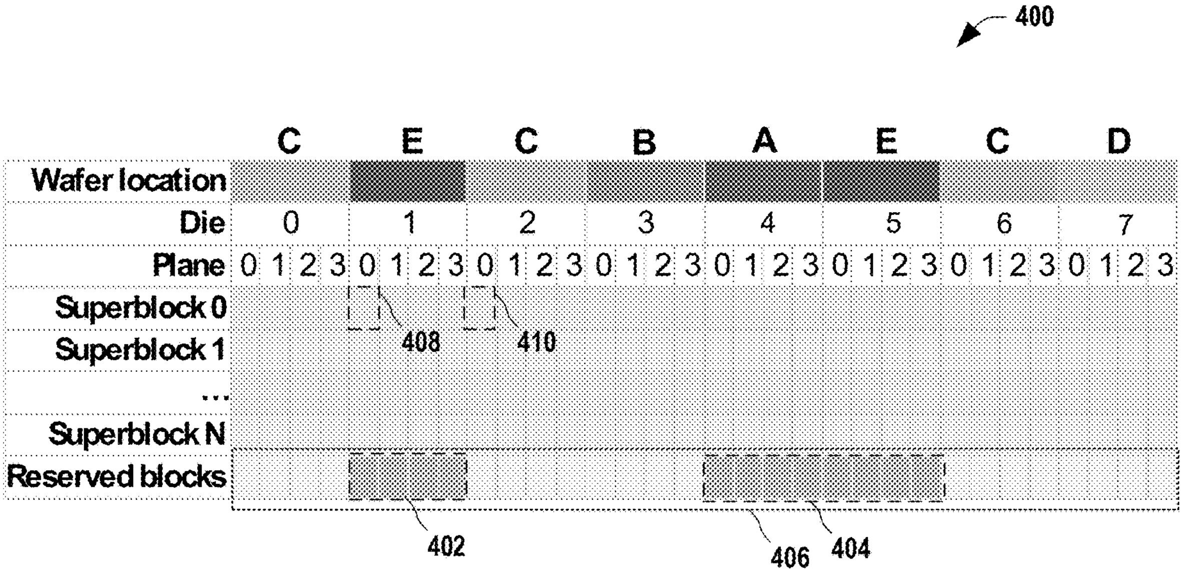
FIG. 4 is an example of a diagram illustrating replacement block cycling based on die wafer location data.

FIG. 4 is a replacement block cycling diagram 400 illustrating cycling of high-priority reserved blocks 402-404 of reserved blocks 406 of the memory device 130 according to one or more examples herein. In the diagram 400, die location failure values corresponding to the die wafer location data 202 are identified for each die of the memory device 130. The die wafer location data 202 can indicate a die location failure value for each die, such as the dies 142-144 that are under wear level management of the memory controller 115. In the diagram 400, the memory device 130 includes a first die (identified as "0"), a second die (identified as "1"), a third die (identified as "2"), a fourth die (identified as "3"), a fifth die (identified as "4"), a sixth die (identified as "5"), a seven die (identified as "6"), and an eight die (identified as "7").

As illustrated in FIG. 4, the first die is assigned a die location failure value of "C", the second die is assigned a die location failure value of "E", the third die is assigned a die location failure value of "C", the fourth die is assigned a die location failure value of "B", the fifth die is assigned a die location failure value of "A", the sixth die is assigned a die location failure value of "E", the seventh die is assigned a die location failure value of "C", and the eighth die is assigned a die location failure value of "D".

The die location failure values as shown in FIG. 4 can correspond to the die location failure values assigned to dies as shown in FIG. 3 in some instances. Each of the dies as shown in FIG. 4 includes four planes (identified respectively as "0", "1", "2" and "3" in FIG. 4). Memory blocks of the dies and thus the planes of the dies can be logically organized into an N number of superblocks, wherein N is an integer value. As illustrated in FIG. 4, the memory device 130 can include Superblock 0, Superblock 1, up to Superblock N (identified as Superblock N in FIG. 4). In some examples, the N number of superblocks of FIG. 4 identifies the superblocks 132-138 of FIG. 1.

According to one or more examples herein, the high-priority reserved blocks 402-404 of the reserved blocks 406 of the memory device 130 can be identified for proactive cycling by the reserved block cycler 123 based on the die wafer location data 202 according to one or more examples herein. In some examples, the second die (identified as "1" in FIG. 4) corresponds to the die 142 and the third die (identified as "2" in FIG. 4) correspond to the die 144 in FIG. 1. In the example of FIG. 4, the active block 182 of FIG. 1 is identified as active block 408 of the second die of the Superblock 0 and the active block 186 of FIG. 1 is identified as active block 410 of the third die of the Superblock 0 (corresponding to the superblock 132).

The die 142 can be a high-risk die whereas the die 144 can be a low-risk die, as described herein in some instances. For example, the reserved blocks of the die 142, including the reserved block 184, can correspond to the high-priority reserved blocks 402. The high-priority reserved blocks 402 includes the reserved block 184 of FIG. 1 in some instances. In some examples, in response to the reserved block cycler 123 determining that the average PEC 210 for the superblocks 132-138 has increased, the reserved block cycler 123 can output the reserved block cycle command 212. The reserved block cycle command 212 can be used to cycle the high-priority reserved blocks 402 and the high-priority reserved blocks 404 while the remaining reserved blocks of the reserved blocks 406 are not cycled according to one or more cycling examples herein.

Figure 5:
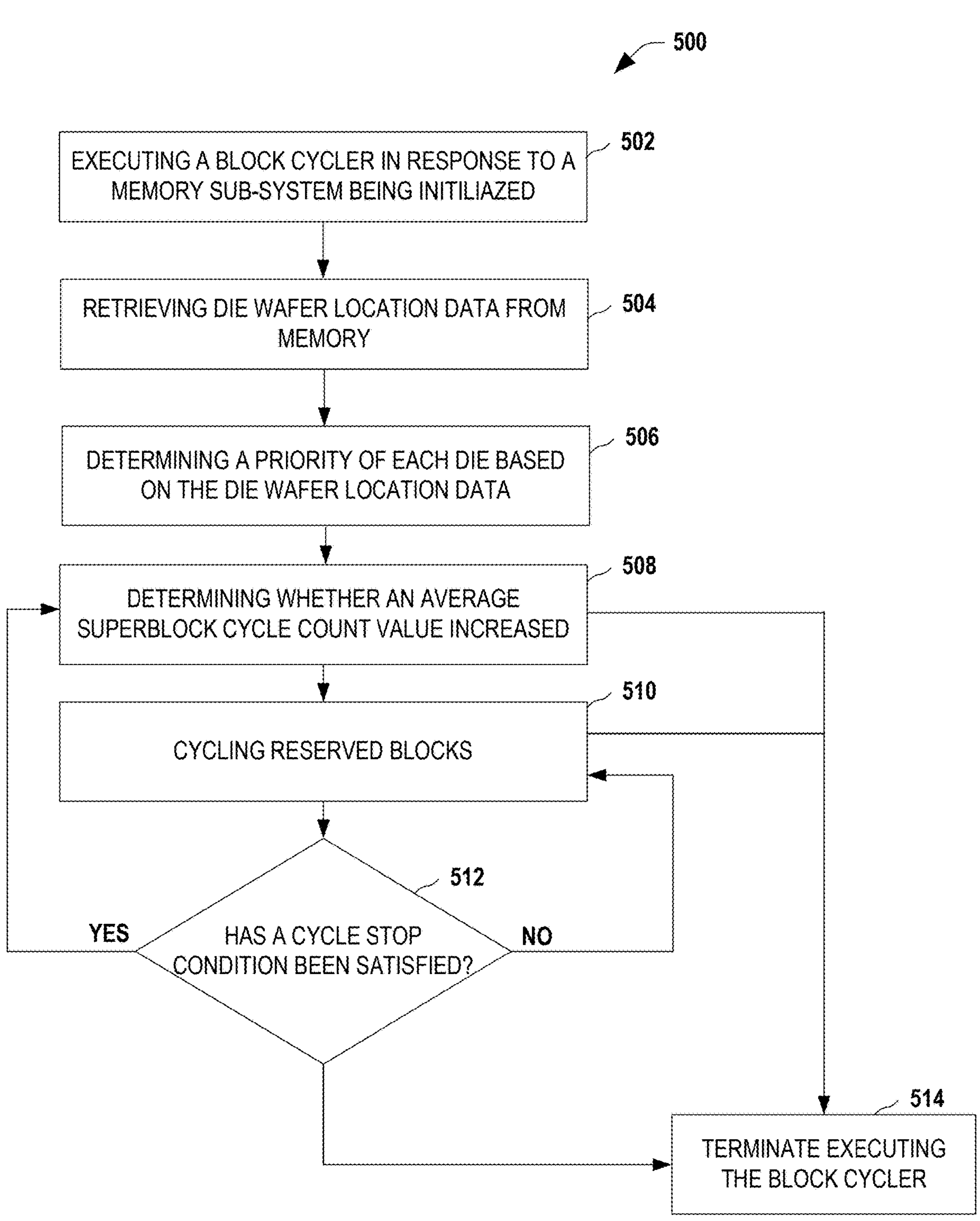
FIG. 5 illustrates a flowchart of an example method for proactive cycling of replacement blocks.

FIG. 5 illustrates a flowchart of an example method 500 for proactive cycling of replacement blocks. The method 500 can be executed by a memory sub-system, such as the memory sub-system 110. Thus, one or more steps of the method 500 can be executed by the controller 115.

At block 502, the controller 115 can execute the reserved block cycler 123 of FIG. 1. The reserved block cycler 123 can be executed in response to the memory sub-system 110 being initialized (e.g., powered on). At block 504, the reserved block cycler 123 can retrieve from the local memory 119 the die wafer location data 202. The die wafer location data 202 can provide a die location failure value for each die of the memory device 130. Each die location failure value can indicate a likelihood of die failure during operation of the memory device.

At block 506, the reserved block cycler 123 can determine a die location failure value for each die, such as the dies 142-144 that are used in the memory sub-system 110 based on the die wafer location data 202 to provide reserved block cycle information 206. For example, at block 506, the reserved block cycler 123 can prioritize each die of the memory device 130 to assign each die of the memory device 130 a respective die location failure value based on the die wafer location data 202.

In some examples, at block 506, the die prioritizer 204 can identify which dies of the memory device 130 are high-risk dies based on the determined priority for each die (on an assigned die location failure value). In some examples, a die of the memory device 130 is identified as a high-risk die in response to determining that the assigned die location failure value for that die satisfies die location failure criteria. The die location failure criteria can be a particular die location failure value that is assigned to a die. For example, if the die is assigned a die location failure value "A", as shown in FIG. 3, the die satisfies the die location failure criteria and can be marked or identified as the high-risk die. A high-risk die correspond to a die of the memory device 130 that is most likely to experience a die failure during operation of the memory device 130. The die prioritizer 204 can provide the reserved block cycle information 206 identifying reserved blocks (e.g., the reserved block 402) of each high-risk die that is to be cycled. In some examples, at block 506, the reserved block cycle information 206 can be stored in the local memory 119 of FIG. 1.

At block 508, the cycle controller 208 monitors the average superblock cycle count value 210 for the superblocks 132-138 to determine whether this value has increased. In some examples, at block 508, the cycle controller 208 determines if the average superblock cycle count value 210 satisfies a cycle count condition. In some examples, the cycle count condition is an increase in the average superblock cycle count value 210.

At block 510, each reserved block of each high-risk die can be cycled (e.g., programmed and/or erased) in response to determining that the average superblock cycle count value 210 has increased. The reserved blocks of each high-risk die can be cycled for a number of cycles. In some examples, at block 510, the controller 115 issues the reserved block cycle command 212 to the memory device 130 to cycle the reserved blocks of the high-risk die.

At block 512, a determination is made as to whether a reserved block cycle condition has been satisfied based on the cycling of the reserved blocks of each high-risk die. The method 500 proceeds from block 512 back to block 508 in response to the reserved block cycle condition being satisfied (shown as a "YES" in FIG. 5). For example, the reserved block cycle condition can be satisfied when the reserved blocks of each high-risk die have been cycled for the number of cycles. In other examples, the method 500 proceeds from block 512 back to block 510 in response to determining that the block cycle condition has not been satisfied (shown as a "NO" in FIG. 5) to continue cycling the reserved blocks of each high-risk die.

At block 508, the cycle controller 208 returns to monitoring the average superblock cycle count value 210 for an increase so that reserved blocks can be cycled once again to have a wear level that is the same or similar to active blocks on the same die as the reserved blocks. In some examples, the method 500 proceeds from block 508 to block 514. At block 514, the controller 115 terminates executing the reserved block cycler 123, for example, in response to the memory sub-system 110 being powered off. In yet some examples, the method 500 proceeds from block 510 or block 512 to block 514 to terminate the execution of the reserved block cycler 123.

Figure 6:
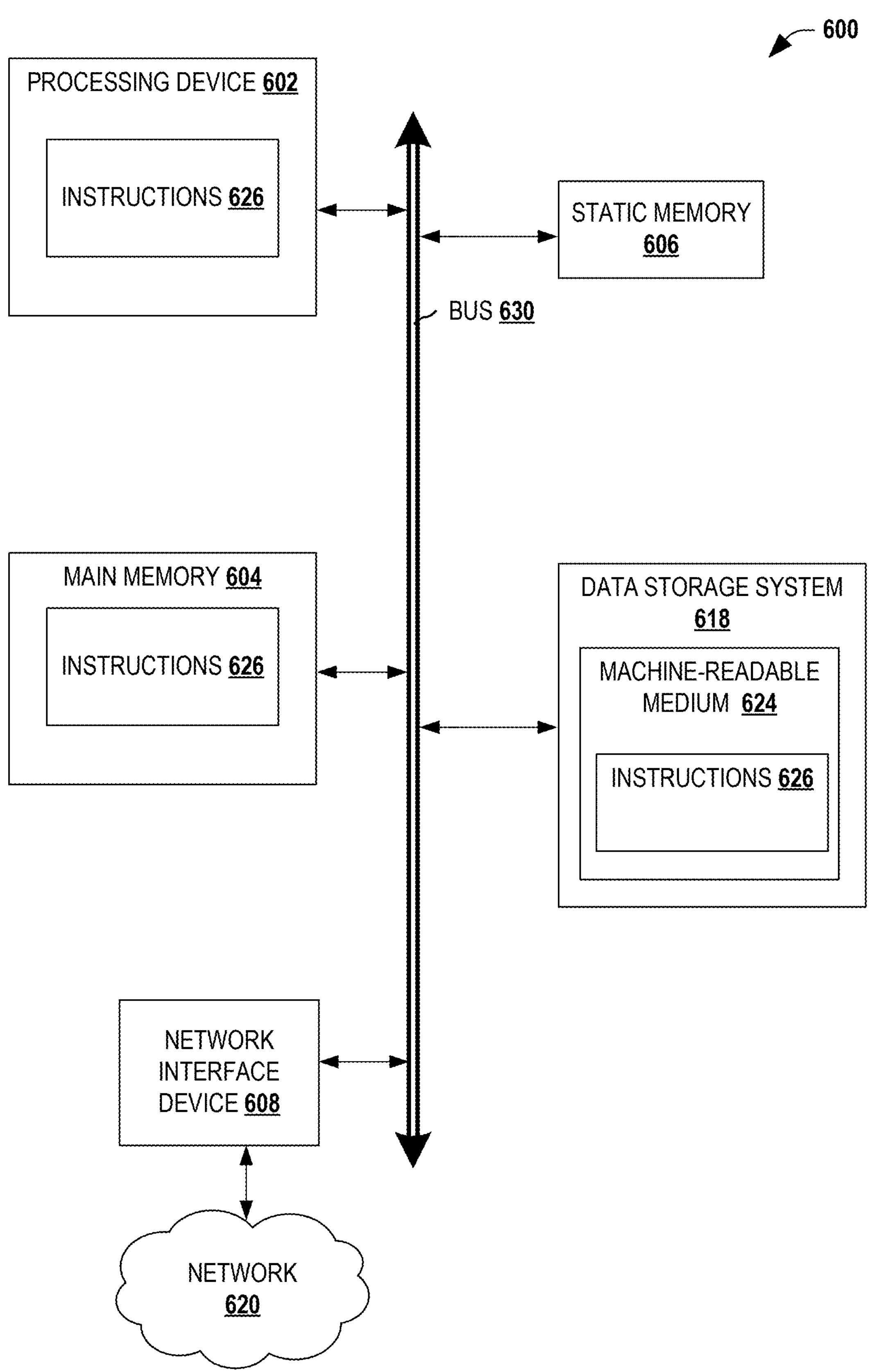
FIG. 6 illustrates an example of a computer system (a machine) in which examples of the present description may operate.

FIG. 6 illustrates an example machine of a computer system 600 (a machine) within which a set of instructions, for causing the machine to perform any one or more of the methodologies discussed herein, can be executed. In some examples, the computer system 600 corresponds to a host system (e.g., the host system 120 of FIG. 1) that includes, is coupled to, or utilizes a memory sub-system (e.g., the memory sub-system 110 of FIG. 1) or is used to perform the operations of a controller (e.g., to execute an operating system to perform operations corresponding to memory block manager 108 of FIG. 1). In other examples, the machine is connected (e.g., networked) to other machines in a LAN, an intranet, an extranet and/or the Internet. In various examples, the machine operates in the capacity of a server or a client machine in client-server network environment, as a peer machine in a peer-to-peer (or distributed) network environment or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge or any machine capable of executing a set of instructions (sequential or otherwise) that specify actions to be taken by that machine. In other examples, the machine may be a computer within an automotive, a data center, a smart factory or other industrial application. Further, while a single machine is illustrated, the term "machine" shall also be taken to include any collection of machines that individually or jointly execute a set (or multiple sets) of instructions to perform the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM) or other non-transitory computer-readable media) and a data storage system 618, which communicate with each other via a bus 630.

The processing device 602 represents one or more general-purpose processing devices such as a microprocessor, a central processing unit, etc. More particularly, the processing device 602 can be a complex instruction set computing (CISC) microprocessor, reduced instruction set computing (RISC) microprocessor, very long instruction word (VLIW) microprocessor or a processor implementing other instruction sets or processors implementing a combination of instruction sets. In some examples, the processing device 602 is implemented with a special-purpose processing devices such as an application specific integrated circuit (ASIC), a field programmable gate array (FPGA), a digital signal processor (DSP), network processor, etc. The processing device 602 is configured to execute instructions 626 for performing the operations discussed herein. In some examples, the computer system 600 includes a network interface device 608 to communicate over the network 620.

The data storage system 618 includes a machine-readable storage medium 624 (also known as a computer-readable medium) that store sets of instructions 626 or software for executing the methodologies and/or functions described herein. The machine-readable storage medium 624 is a non-transitory medium. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618 and/or main memory 604 can correspond to the memory sub-system 110 of FIG. 1. Accordingly, the machine-readable storage medium 624, the data storage system 618 and/or the main memory 604 are examples of non-transitory computer-readable media.

In some examples, the instructions 626 include instructions to implement functionality corresponding to the memory block manager 108 of FIG. 1. While the machine-readable storage medium 624 is shown in an example to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared and otherwise manipulated. It has proven convenient at times, principally for reasons of common usage, to refer to these signals as bits, values, elements, symbols, characters, terms, numbers, etc.

It is noted, however, that all of these and similar terms are to be associated with the appropriate physical quantities and are merely convenient labels applied to these quantities. This description can refer to the action and processes of a computer system, or similar electronic computing device, which manipulates and transforms data represented as physical (electronic) quantities within the computer system's registers and memories into other data similarly represented as physical quantities within the computer system memories or registers or other such information storage systems.

This description also relates to an apparatus for performing the operations herein. This apparatus can be specially constructed for the intended purposes or this apparatus can include a general purpose computer selectively activated or reconfigured by a computer program stored in the computer. Such a computer program can be stored in a computer readable storage medium, such as, but not limited to, any type of disk including floppy disks, optical disks, CD-ROMs, magnetic-optical disks, read-only memories (ROMs), random access memories (RAMs), EPROMs, EEPROMs, magnetic or optical cards or any type of media suitable for storing electronic instructions, each coupled to a computer system bus.

The algorithms and displays presented herein are not inherently related to any particular computer or other apparatus. Various general purpose systems can be used with programs in accordance with the descriptions herein, or it can prove convenient to construct a more specialized apparatus to perform the method. In addition, the present disclosure is not described with reference to any particular programming language. It will be appreciated that a variety of programming languages can be used to implement the teachings of the disclosure as described herein.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications and variations that fall within the scope of this application, including the appended claims. As used herein, the term "includes" means includes but not limited to, the term "including" means including but not limited to. The term "based on" means "based at least in part on". Additionally, where the disclosure or claims recite "a," "an," "a first" or "another" element, or the equivalent thereof, it should be interpreted to include one or more than one such element, neither requiring nor excluding two or more such elements.

What is claimed is:

1. A method comprising:

retrieving, by a controller, die wafer location data, the die wafer location data providing a die location failure value for each die of a memory device, each die location failure value indicating a likelihood of die failure during operation of the memory device;

identifying, by the controller, a die of the memory device as a high-risk die corresponding to a die of the memory device as most likely to experience a die failure during operation of the memory device based on the die wafer location data;

identifying, by the controller, a reserved block of the high-risk die; and cycling, by the controller, the reserved block of the high-risk die.

2. The method of claim 1, further comprising issuing, by the controller, a reserved block cycle command to the memory device to cycle the reserved block of the high-risk die.

3. The method of claim 2, wherein the memory sub-system is a solid-state drive (SSD).

4. The method of claim 1, further comprising:

monitoring, by the controller, a cycle count value for superblocks of the memory device, wherein one of the superblocks includes the reserved block of the high-risk die;

and cycling, by the controller, the reserved block of the high-risk die in response to the cycle count value satisfying a cycle count condition.

5. The method of claim 1, wherein the cycle count condition is an increase in the cycle count value.

6. The method of claim 5, wherein the cycle count value is an average superblock cycle count value.

7. The method of claim 6, wherein the average superblock cycle count value is computed based on superblock cycle count values of the superblocks.

8. The method of claim 1, wherein the controller cycles the reserved block of the high-risk die until a reserved block cycle condition has been satisfied.

9. The method of claim 1, wherein the controller execute the method of claim 1 in response to a memory sub-system being initialized, the memory sub-system including the controller.

10. The method of claim 1, wherein the memory device is a Not-AND (NAND) memory device.

11. The method of claim 1, wherein the die of the memory device is identified as the high-risk die in response to determining that the assigned die location failure value satisfies die location failure criteria.

12. A system for cycling a reserved block of a memory device comprising dies, a respective die of the dies including the replacement block, the system comprising:

a processing device coupled to the memory device, the processing device to perform operations comprising:

identifying a respective die of the dies as a high-risk die corresponding to a die of the memory device as most likely to experience a die failure during operation of the memory device based on die wafer location data; and cycling the reserved block of the high-risk die in response to the identifying.

13. The system of claim 12, wherein the operations further comprise issuing a reserved block cycle command to the memory device to cycle the reserved block of the high-risk die.

14. The system of claim 13, wherein the operations further comprise:

monitoring a cycle count value for superblocks of the memory device, wherein one of the superblocks includes the reserved block of the high-risk die; and cycling the reserved block of the high-risk die in response to the cycle count value satisfying a cycle count condition.

15. The system of claim 14, wherein the cycle count condition is an increase in the cycle count value.

16. The system of claim 12, wherein the reserved block of the high-risk die is cycled until a reserved block cycle condition has been satisfied.

17. The system of claim 12, wherein the system is a solid-state drive and the memory device is a Not-AND (NAND) memory device.

18. A non-transitory computer-readable storage medium comprising instructions that, when executed by a processing device, cause the processing device to perform operations comprising:

retrieving die wafer location data from a memory, the die wafer location data providing a die location failure value for each die of a memory device indicating a likelihood of die failure during operation of the memory device;

identifying a die of the memory device as a high-risk die corresponding to a die of the memory device as most likely to experience a die failure during operation of the memory device based on the retrieved die wafer location data;

identifying a reserved block of the high-risk die; and cycling the reserved block of the high-risk die.

19. The non-transitory computer-readable storage medium of claim 18, wherein the operations further comprise:

monitoring a cycle count value for superblocks of the memory device, wherein one of the superblocks includes the reserved block of the high-risk die; and cycling the reserved block of the high-risk die in response to the cycle count value satisfying a cycle count condition.

20. The non-transitory computer-readable storage medium of claim 18, wherein the die of the memory device is identified as the high-risk die in response to determining that the assigned die location failure value satisfies die location failure criteria.

* * * * *